US012701794B2

(12) United States Patent
Iwamoto

(10) Patent No.: US 12,701,794 B2
(45) Date of Patent: Aug. 4, 2026

(54) PHOTOVOLTAIC MODULE AND INTERCONNECTOR

(71) Applicant: TOYOTA JIDOSHA KABUSHIKI KAISHA, Toyota (JP)

(72) Inventor: Shoichi Iwamoto, Fuji (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 19/040,871

(22) Filed: Jan. 30, 2025

(65) Prior Publication Data

US 2025/0318285 A1     Oct. 9, 2025

(30) Foreign Application Priority Data

Apr. 4, 2024     (JP) ................................. 2024-061016

(51) Int. Cl.
H10F 19/90          (2025.01)
H10F 77/00          (2025.01)
(52) U.S. Cl.
CPC ......... H10F 19/904 (2025.01); H10F 77/937 (2025.01)
(58) Field of Classification Search
CPC ........... H10F 19/90; H10F 19/902–908; H10F 77/937
See application file for complete search history.

(56) References Cited

U.S. PATENT DOCUMENTS

| | | | |
|---|---|---|---|
| 2016/0284895 A1* | 9/2016 | Hashimoto | ........... H10F 77/219 |
| 2017/0040479 A1* | 2/2017 | Tourino | ................. H10F 19/80 |
| 2018/0040755 A1 | 2/2018 | Inaba et al. | |
| 2019/0131473 A1* | 5/2019 | Inaba | .................... H10F 19/902 |
| 2019/0140123 A1 | 5/2019 | Inaba et al. | |

FOREIGN PATENT DOCUMENTS

| | | |
|---|---|---|
| JP | 2017-199826 A | 11/2017 |
| JP | 2018-026380 A | 2/2018 |

* cited by examiner

*Primary Examiner* — Jayne L Mershon
(74) *Attorney, Agent, or Firm* — SoraIP, Inc.

(57)          ABSTRACT

The photovoltaic module has an interconnector. The interconnector includes: a first interconnector including a first electrode connected to a first busbar electrode of the first photovoltaic cell, a second electrode connected to a fourth busbar electrode of the second photovoltaic cell, and a first connector connecting the first electrode and the second electrode; a second interconnector including a third electrode connected to a second busbar electrode of the first photovoltaic cell, a fourth electrode connected to a third busbar electrode of the second photovoltaic cell, and a second connector connecting the third electrode and the fourth electrode; wherein the first connector has a first expanding and contracting portion that is expandable and contractible, and the second connector has a second expanding and contracting portion that is expandable and contractible.

2 Claims, 6 Drawing Sheets

PHOTOVOLTAIC MODULE AND INTERCONNECTOR

CROSS-REFERENCE TO RELATED APPLICATION

This application claims priority to Japanese Patent Application No. 2024-061016 filed on Apr. 4, 2024, incorporated herein by reference in its entirety.

BACKGROUND

1. Technical Field

The present disclosure relates to photovoltaic modules and interconnectors.

2. Description of Related Art

A photovoltaic module is a device that can generate predetermined power when irradiated with sunlight. Such a photovoltaic module is used in, for example, a solar panel that is installed on a vehicle body of a passenger vehicle.

Japanese Unexamined Patent Application Publication No. 2018-26380 (JP 2018-26380 A) discloses a solar panel provided with an interconnector. The interconnector includes a first electrode connected to a first photovoltaic cell, a second electrode connected to a second photovoltaic cell, and a connector connecting the first electrode and the second electrode. The connector includes a first bypass portion on one side as a first bypass portion, a second bypass portion on the one side as a second bypass portion, and a first connecting portion as a connecting portion. The first bypass portion on the one side includes a first curved portion whose end on the first electrode side is curved in the opposite direction to the second electrode and connected to the first electrode.

In this type of solar panel, the spacing between adjacent first and second photovoltaic cells may change as the solar panel may expand and contract due to a temperature change during manufacturing or while in use. In the technique described in JP 2018-26380 A, the interconnector is shaped to be diverted and curved. Accordingly, when the solar panel expands and contracts due to a temperature change, the interconnector absorbs a change in spacing between the first and second photovoltaic cells. This reduces breakage of the interconnector.

SUMMARY

In recent years, a multi-wire technology has been used for photovoltaic modules in order to improve power generation efficiency and to reduce a decrease in power generation due to cracking of photovoltaic cells. The multi-wire technology is a technology in which a large number of busbar electrodes are provided in photovoltaic cells.

One possible approach is to allow a plurality of busbar electrodes provided in a first photovoltaic cell and a plurality of busbar electrodes provided in a second photovoltaic cell located adjacent to and spaced apart from the first photovoltaic cell in a first direction to be electrically connected via a plurality of the interconnectors described in JP 2018-26380 A. However, the larger the number of busbar electrodes provided in the first and second photovoltaic cells, the smaller the size of each interconnector (specifically, the size in a second direction substantially perpendicular to the first direction) needs to be.

In the case where the interconnector described in JP 2018-26380 A is applied to a photovoltaic module that uses the multi-wire technology, stress tends to concentrate on a small-curvature portion of the interconnector when the spacing between the first photovoltaic cell and the second photovoltaic cell changes. The technique described in JP 2018-26380 A is therefore disadvantageous in that the interconnector may be broken due to the stress and the first photovoltaic cell and the second photovoltaic cell may not be able to be suitably electrically connected.

The present disclosure was made to solve such an issue. It is an object of the present disclosure to provide a photovoltaic module and an interconnector that reduce the possibility of defective electrical connection between a first photovoltaic cell and a second photovoltaic cell when a spacing between the first and second photovoltaic cells that are adjacent to each other changes and that has improved durability.

A photovoltaic module according to an embodiment includes:

a first photovoltaic cell;

a second photovoltaic cell located adjacent to and spaced apart from the first photovoltaic cell in a first direction; and an interconnector that allows the first photovoltaic cell and the second photovoltaic cell to be electrically connected.

The first photovoltaic cell includes a first busbar electrode and a second busbar electrode that are located adjacent to and spaced apart from each other in a second direction substantially perpendicular to the first direction.

The second photovoltaic cell includes a third busbar electrode and a fourth busbar electrode that are located adjacent to and spaced apart from each other in the second direction. The third busbar electrode is located next to the first busbar electrode substantially linearly in the first direction. The fourth busbar electrode is located next to the second busbar electrode substantially linearly in the first direction.

The interconnector includes a first interconnector including a first electrode connected to the first busbar electrode, a second electrode connected to the fourth busbar electrode, and a first connector connecting the first electrode and the second electrode, and a second interconnector including a third electrode connected to the second busbar electrode, a fourth electrode connected to the third busbar electrode, and a second connector connecting the third electrode and the fourth electrode.

The first connector includes a first expanding and contracting portion that is expandable and contractible in a direction connecting the first electrode and the second electrode.

The second connector includes a second expanding and contracting portion that is expandable and contractible in a direction connecting the third electrode and the second electrode.

The present disclosure thus provides a photovoltaic module and an interconnector that reduce the possibility of defective electrical connection between a first photovoltaic cell and a second photovoltaic cell when a spacing between the first and second photovoltaic cells that are adjacent to each other changes and that has improved durability.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein.

DETAILED DESCRIPTION OF EMBODIMENTS

First Embodiment

Figure 1:
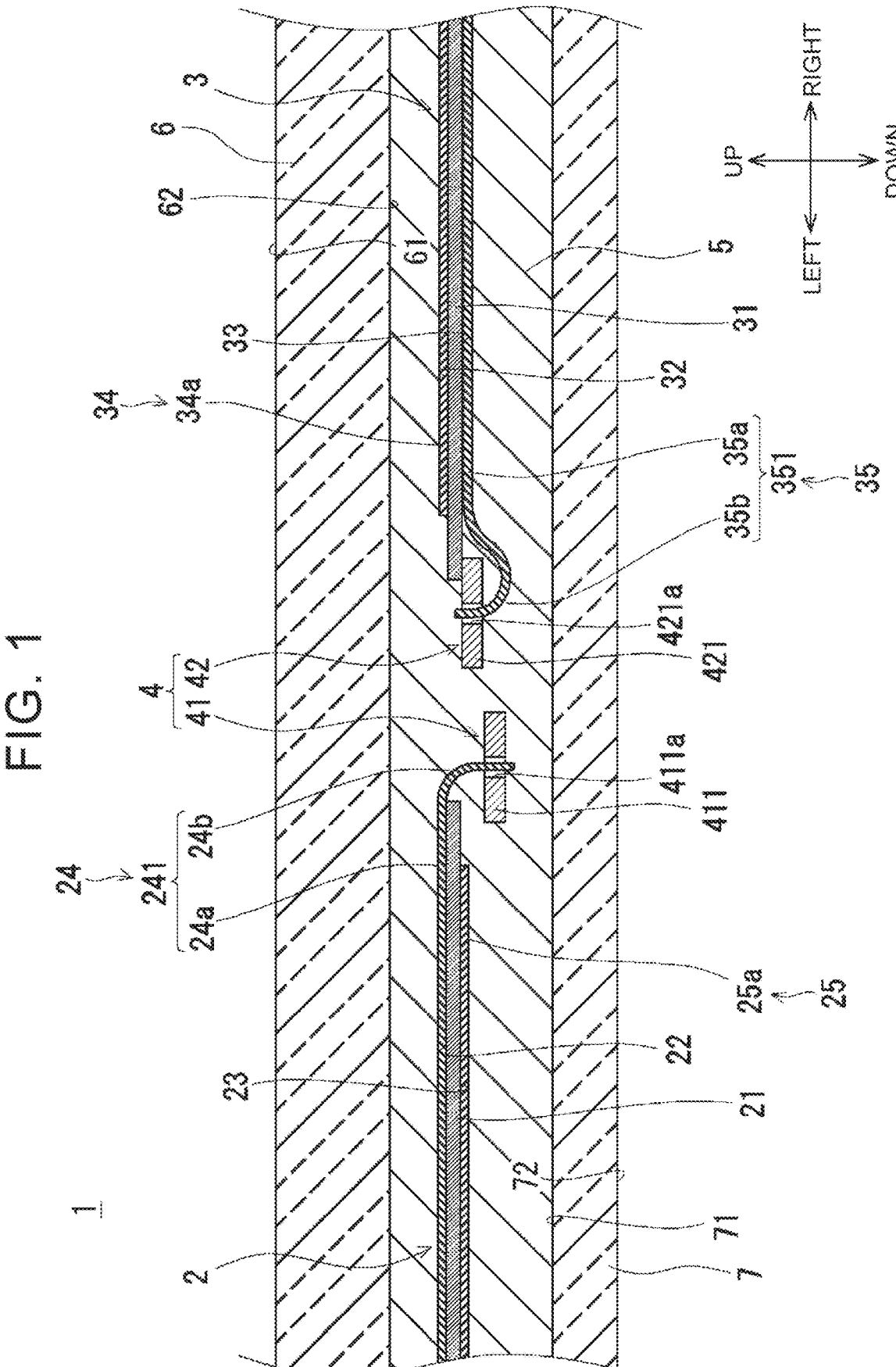
FIG. 1 is a cross-sectional view showing part of a photovoltaic module according to a first embodiment.

Hereinafter, embodiments of the present disclosure will be described with reference to the drawings. However, the present disclosure is not limited to the following embodiments. Further, in order to clarify the description, the following description and drawings have been simplified as appropriate. Those shown in the drawings are a part of the whole, and other configurations (not shown) are actually included in many. In the following description, the same or equivalent elements are denoted by the same reference numerals, and redundant description will be omitted.

FIG. 1 is a cross-sectional view illustrating a part of a photovoltaic module according to Embodiment 1. The photovoltaic module 1 shown in FIG. 1 is, for example, a device that is mounted on a vehicle body of a passenger vehicle and converts sunlight into electric power. The photovoltaic module 1 is not limited to being mounted on a vehicle body, and may be disposed with respect to a building or a facility.

Figure 2:
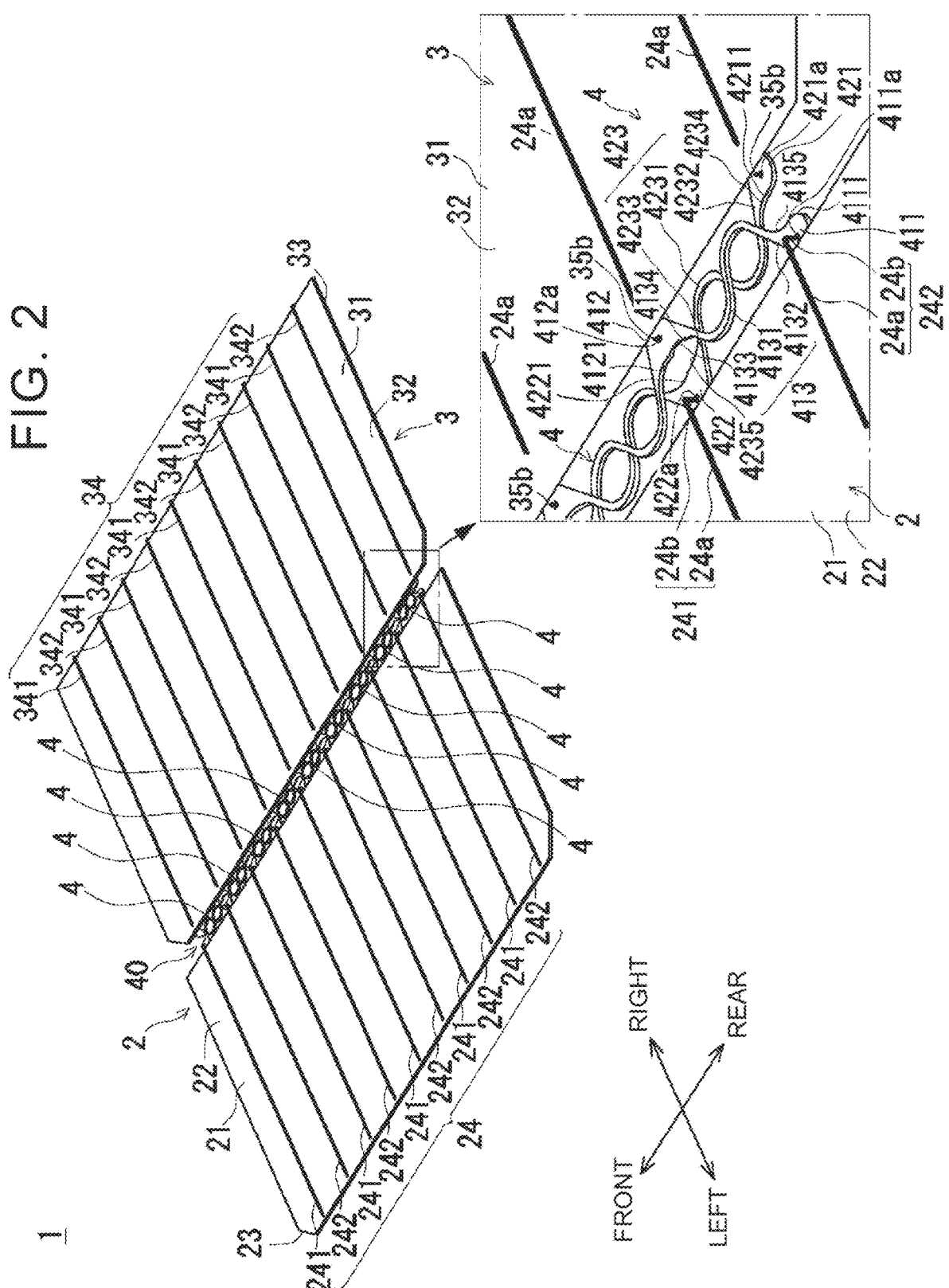
FIG. 2 is a perspective view illustrating part of the photovoltaic module according to the first embodiment.

In the present embodiment, the horizontal direction of the photovoltaic module 1 and the vertical direction which is the thickness direction of the photovoltaic module 1 are defined by the arrow direction shown in FIG. 1. The left-right direction and the up-down direction are perpendicular. In FIG. 2 and the like, in addition to defining the respective directions of the photovoltaic module 1 corresponding to FIG. 1, the front-rear direction of the photovoltaic module 1 is defined. The front-rear direction is perpendicular to each of the left-right direction and the up-down direction. The lateral direction of the photovoltaic module 1 is a specific example of the first direction. In the following description, the left direction corresponds to one side of the first direction, and the right direction corresponds to the other side of the first direction. The front-rear direction of the photovoltaic module 1 is a specific example of the second direction. In the following description, the rear direction corresponds to one side in the second direction, and the front direction corresponds to the other side in the second direction. Note that each of these directions is an example for convenience of explanation, and each direction does not relate to a direction in use of the photovoltaic module 1.

As illustrated in FIG. 1, the photovoltaic module 1 includes a first photovoltaic cell 2, a second photovoltaic cell 3, an interconnector 4, a sealing material 5, a front surface member 6, and a back surface member 7. The photovoltaic module 1 has a structure in which a first photovoltaic cell 2 and a second photovoltaic cell 3 connected by a plurality of interconnectors 4 are provided between a front surface member 6 and a back surface member 7, and are sealed by a sealing material 5.

The first photovoltaic cell 2 is located on the left side, which is one side in the first direction. The second photovoltaic cell 3 is located on the right side, which is the other side in the first direction. The second photovoltaic cell 3 is adjacent to and spaced apart from the first photovoltaic cell 2 in the left-right direction that is the first direction. The spacing between the first photovoltaic cell 2 and the second photovoltaic cell 3 connected by the plurality of interconnectors 4 is, for example, 6 mm. The spacing between the first photovoltaic cell 2 and the second photovoltaic cell 3 can be appropriately changed according to the specifications of the photovoltaic module 1. In the following description, the spacing between the first photovoltaic cell 2 and the second photovoltaic cell 3 may be referred to as "cell spacing".

The first and second photovoltaic cells 2 and 3 have the same configuration and exhibit the same performance. The first photovoltaic cell 2 includes a first semiconductor substrate 21. The first semiconductor substrate 21 includes a first substrate front surface 22 and a first substrate back surface 23 located on the opposite side of the first substrate front surface 22. The second photovoltaic cell 3 includes a second semiconductor substrate 31. The second semiconductor substrate 31 includes a second substrate front surface 32 and a second substrate back surface 33 located on the opposite side of the second substrate front surface 32. As the first and second semiconductor substrates 21 and 31, for example, a single-crystal or polycrystalline crystalline silicon semiconductor can be used. As the first and second semiconductor substrates 21 and 31, crystal-based semiconductors other than crystal-based silicon may be used. The first substrate front surfaces 22, 32 are upwardly facing surfaces. The first and second substrate back surfaces 23, 33 are downwardly facing surfaces.

The first and second photovoltaic cells 2, 3 are, for example, double-sided electrode type (also referred to as double-sided junction type) photovoltaic cells. The first photovoltaic cell 2 includes a front surface electrode 24 and a back surface electrode 25. The second photovoltaic cell 3 includes a front surface electrode 34 and a back surface electrode 35. In the first photovoltaic cell 2, the front surface electrode 24 and the back surface electrode 25 are provided so as to face each other. In the second photovoltaic cell 3, the front surface electrode 34 and the back surface electrode 35 are provided so as to face each other. FIG. 1 shows first busbar electrodes 241, 341 included in each of the front surface electrodes 24, 34, and third busbar electrodes 251, 351 included in each of the back surface electrodes 25, 35.

The interconnector 4 is a wiring material that allows the first photovoltaic cell 2 and the second photovoltaic cell 3 to be electrically connected. The interconnector 4 includes a first interconnector 41 and a second interconnector 42. The first and second interconnectors 41, 42 have a flat plate shape that is horizontal to the first and second photovoltaic cells 2, 3.

The first interconnector 41 is located below the front surface electrode 24 and the first semiconductor substrate 21. The second interconnector 42 is located below the front surface electrode 34 and the second semiconductor substrate 31. The second interconnector 42 is disposed adjacent to and spaced apart from the first interconnector 41 in the up-down direction so as not to interfere with the first interconnector 41. The second interconnector 42 is positioned above the first interconnector, for example. The positional relationship between the first and second interconnectors in the up-down direction is not limited to this, and the second interconnector 42 may be positioned below the first interconnector 41.

The sealing material 5 fixes the first photovoltaic cell 2, the second photovoltaic cell 3, and the interconnector 4 between the front surface member 6 and the back surface member 7 so as to seal them. The sealing material 5 protects the first and second photovoltaic cells 2, 3 by sealing the first and second photovoltaic cells 2, 3. The sealing material 5 is formed of a light-transmitting resin. For example, an ethylene-vinyl acetate copolymer (EVA) can be used as the sealing material 5. The resin forming the sealing material 5 is not limited to EVA, and a polyolefin-based resin, an ionomer-based resin, a silicone-based resin, or the like may be used.

The front surface member 6 is a plate-like or film-like member for protecting the first and second photovoltaic cells 2, 3 together with the sealing material 5. The front surface member 6 is provided on the first and second substrate front surfaces 22, 32 sides with respect to the sealing material 5. The front surface member 6 is a light-transmissive member having an incident surface 61 on which sunlight is incident and an emission surface 62 on the opposite side of the incident surface 61.

The incident surface 61 and the emission surface 62 are, for example, flat surfaces. Incidentally, the incident surface 61 and the emission surface 62 are not limited to a flat surface, and may be a curved surface. The incident surface 61 is disposed horizontally, for example. The emission surface 62 is arranged so as to be substantially parallel to the incident surface 61. The first and second photovoltaic cells 2, 3 are disposed so as to face the emission surface 62. That is, the first and second photovoltaic cells 2, 3 are disposed along the emission surface 62. The emission surface 62 faces the first and second substrate front surfaces 22, 32. The first and second substrate front surfaces 22, 32 are arranged so as to be substantially parallel to the emission surface 62, for example. The sunlight incident on the incident surface 61 passes through the front surface member 6, exits from the emission surface 62, passes through the sealing material 5, and enters the first and second substrate front surfaces 22, 32.

The back surface member 7 is a plate-shaped member for protecting the first and second photovoltaic cells 2, 3 together with the sealing material 5. The back surface member 7 is provided on the first and second substrate back surfaces 23, 33 sides with respect to the sealing material 5. The back surface member 7 is also referred to as a back surface plate. The back surface member 7 has a front surface 71 facing the front surface member 6, the first and second photovoltaic cells, and the sealing material 5, and a back surface 72 located on the opposite side of the front surface 71.

The first and second photovoltaic cells 2, 3 are disposed so as to face the front surface 71. That is, the first and second photovoltaic cells 2, 3 are disposed along the front surface 71. The back surface 72 is arranged to be substantially parallel to the front surface 71, for example.

The front surface member 6 and the back surface member 7 are preferably formed of, for example, a light-transmissive resin such as a polycarbonate resin or an acrylic resin. Since the front surface member 6 and the back surface member 7 are formed of a light-transmitting resin, the weight of the photovoltaic module 1 can be reduced as compared with, for example, a case where the front surface member 6 and the back surface member 7 are formed of glass.

However, the front surface member 6 is not limited to a polycarbonate resin or an acrylic resin, and may be formed of another light-transmissive resin such as polyethylene terephthalate (PET) or polyethylene naphthalate (PEN) or glass. The back surface member 7 is not limited to a polycarbonate resin or an acryl resin, and may be formed of a resin such as PET, PEN or a metal such as steel (for example, S45C) or an aluminum alloy. When the back surface member 7 is made of resin, fibers or fillers may be included in the resin in order to increase the rigidity. The thickness of each of the front surface member 6 and the back surface member 7 can be changed as appropriate.

Next, FIG. 2 is a perspective view showing a part of the photovoltaic module according to the first embodiment. FIG. 2 shows a first photovoltaic cell 2 and a second photovoltaic cell 3 connected by an interconnector 4. In FIG. 2, an enlarged view of a part thereof is shown in a dashed-dotted line. The first photovoltaic cell 2, the second photovoltaic cell 3, and the interconnector 4 will be described in more detail with reference to FIG. 2.

As shown in FIG. 2, the first and second photovoltaic cells 2, 3 are divided cells obtained by dividing cells (also referred to as full cells) of a standard size. Examples of the divided cells include those obtained by dividing a cell of a standard size into halves (half cells). In the divided cell, the current value of the current per cell can be reduced (halved in the case of a half cell), and thus the power loss of the photovoltaic module 1 can be reduced. In addition, since the number of the divided cells connected in series can be larger than that of the cells of the standard size, the voltage can be increased.

In the present embodiment, since the first and second photovoltaic cells 2, 3 are half-cells obtained by dividing a cell having a size of about 182 mm angle into two, their lengths are 182 mm and their widths are 91 mm. Further, FIG. 1 and FIG. 2 show the first photovoltaic cell 2 and the second photovoltaic cell 3 which are two adjacent photovoltaic cells in the left-right direction, but the number of photovoltaic cells included in the photovoltaic module 1 is not limited to two. The size and the number of the first and second photovoltaic cells 2, 3 can be appropriately changed according to the size of the photovoltaic module 1.

The first and second photovoltaic cells 2, 3 each have a substantially rectangular flat plate shape. The shapes of the first and second photovoltaic cells 2, 3 are not limited to a substantially rectangular flat plate shape, and may be substantially square or any other polygonal flat plate shape. Further, the shapes of the first and second photovoltaic cells 2, 3 are not limited to a flat plate shape.

The front surface electrodes 24, 34 provided on the first and second substrate front surfaces 22, 32 include a total of ten busbar electrodes, namely five first busbar electrodes 241, 341 and five second busbar electrodes 242, 342. The first busbar electrodes 241, 341 and the second busbar electrodes 242, 342 are arranged alternately adjacent to and spaced apart from each other in the front-rear direction that is the second direction. The back surface electrodes 25 and 35 provided on the first and second substrate back surfaces 23, 33 include a total of ten busbar electrodes, namely five third busbar electrodes 251, 351 and five fourth busbar electrodes 252, 352. The third busbar electrodes 251, 351 and the fourth busbar electrodes 252, 352 are arranged alternately adjacent to and spaced apart from each other in the front-rear direction. The combination of the first busbar electrodes 241, 341 and the second busbar electrodes 242, 342 may be one or more sets, and the combination of the third busbar electrodes 251, 351 and the fourth busbar electrodes 252, 352 may be one or more sets. The number of the first to fourth busbar electrodes 241 to 352 can be appropriately changed in accordance with the area of the first and second photovoltaic cells 2, 3.

In each of the first and second photovoltaic cells 2, 3, the first busbar electrodes 241 and 341 and the third busbar electrodes 251 and 351 are provided so as to face each other. The second busbar electrodes 242, 342 and the fourth busbar electrodes 252, 352 are provided so as to face each other. The spacing between the busbar electrodes of the first busbar electrodes 241 and 341 and the second busbar electrodes 242 and 342 adjacent to each other in the front-rear direction is, for example, 17.3 mm. In addition, in the present embodiment, the spacing between the busbar electrodes of the third busbar electrodes 251, 351 and the fourth busbar electrodes 252, 352 adjacent to each other in the front-rear direction is also 17.3 mm, for example. The spacing between the busbar electrodes can be changed as appropriate according to the specifications of the first and second photovoltaic cells 2, 3.

The third busbar electrodes 351 formed on the second substrate back surface 33 are arranged substantially linearly in the left-right direction with the first busbar electrodes 241 formed on the first substrate front surface 22. The fourth busbar electrodes 352 formed on the second substrate back surface 33 are arranged substantially linearly in the left-right direction with the second busbar electrodes 242 formed on the first substrate front surface 22. The third busbar electrodes 251 formed on the first substrate back surface 23 are arranged substantially linearly in the left-right direction with the first busbar electrodes 341 formed on the second substrate front surface 32. The fourth busbar electrodes 252 formed on the first substrate back surface 23 are arranged substantially linearly in the left-right direction with the second busbar electrodes 342 formed on the second substrate front surface 32.

The first to fourth busbar electrodes 241 to 352 have, for example, a substantially circular cross section cut in the front-rear direction. The cross-section of the first to fourth busbar electrodes 241 to 352 is, for example, 0.3 mm. The first to fourth busbar electrodes 241 to 352 are made of, for example, a copper alloy. The first to fourth busbar electrodes 241 to 352 may be formed of copper, or may be formed of a metal other than copper or a copper alloy. The cross-sectional shapes and diameters of the first to fourth busbar electrodes 241 to 352 can be appropriately changed according to the magnitude of the current flowing therethrough.

The first and second busbar electrodes 241, 242 have a first base portion 24a and a first protruding end portion 24b, respectively. Here, referring to FIG. 1, the first base portion 24a and the first protruding end portion 24b included in the first photovoltaic cell 2 will be described.

As shown in FIG. 1, the first base portion 24a is at least partially in contact with the first substrate front surface 22. The first base portion 24a extends linearly from one end side to the other end side in the left-right direction while being in contact with the first substrate front surface 22.

The first protruding end portion 24b is located on the side of the second photovoltaic cell 3, which is the right side in the left-right direction. The first protruding end portion 24b protrudes beyond the first semiconductor substrate 21 toward the second photovoltaic cell 3. The first protruding end portion 24b extends downward from the other end of the first base portion 24a.

The third and fourth busbar electrodes 251, 252 each have a second base portion 25a and a second protruding end portion 25b. Here, referring to FIG. 1, the second base portion 25a and the second protruding end portion 25b included in the second photovoltaic cell 3 will be specifically described.

As shown in FIG. 1, at least a part of the second base portion 25a is in contact with the second substrate back surface 33. The second base portion 25a is bent downward such that one end side thereof extends linearly in the left-right direction while being in contact with the second substrate back surface 33, and the other end side thereof is gradually separated from the second substrate back surface 33. The second protruding end portion 25b is located on the first photovoltaic cell 2 side, which is the left side in the left-right direction. The second protruding end portion 25b protrudes beyond the second semiconductor substrate 31 toward the first photovoltaic cell 2. The second protruding end portion 25b extends upward from the other end of the second base portion 25a.

Further, the front surface electrodes 24, 34 have a plurality of finger electrodes (not shown) located adjacent to and spaced apart from each other in the left-right direction, and extending in the front-rear direction so as to connect the first busbar electrodes 241, 341 and the second busbar electrodes 242, 342. Each of the busbar electrodes (first, second, third, and fourth busbar electrodes) and the finger electrode can be formed by a printing method such as screen printing using a thermosetting conductive paste containing conductive particles such as copper particles and a binder such as resin.

As shown in FIG. 2, in the photovoltaic module 1, nine interconnectors 4 are connected to form an interconnector group 40 extending in the front-rear direction. Note that the number of interconnectors 4 constituting the interconnector group 40 can be appropriately changed in accordance with the number of busbar electrodes and the like.

The interconnector 4 is formed of, for example, a Cu—Ni—P alloy. When a Cu—Ni—P alloy having high strength and high conductivity is used, the first and second connectors 413, 423 that are elastically deformable, which will be described later, can be easily formed. Specific examples of Cu—Ni—P alloy include KLF170 (registered trademark). Note that the interconnector 4 may be formed of copper, may be formed of a copper alloy other than a Cu—Ni—P alloy, or may be formed of a metal other than copper or a copper alloy.

The interconnector group 40, that is, the nine first interconnectors 41 included in the nine interconnectors 4 are integrally formed by punching a copper plate. The interconnector group 40, i.e., the nine second interconnectors 42 included in the nine interconnectors 4, are also integrally formed by punching a copper plate. The first and second interconnectors 42 may be formed using a metal plate other than a copper plate.

The first interconnector 41 includes a first electrode 411, a second electrode 412, and a first connector 413. The first electrode 411 is connected to the first busbar electrode 241. The first electrode 411 is located on the front end side and the left end side of the interconnector 4. The first electrode 411 has a substantially circular shape when viewed from the up-down direction. The first electrode 411 has a right end edge 4111 located on the right side.

A first insertion hole 411*a* is formed in the first electrode 411. The first insertion hole 411*a* penetrates vertically. The first insertion hole 411*a* is formed, for example, substantially in the center of the first electrode 411. The first protruding end portion 24*b* of the first busbar electrode 241 is inserted into the first insertion hole 411*a* from above. The first protruding end portion 24*b* inserted into the first insertion hole 411*a* is bonded to the first electrode 411 by a bonding process such as soldering.

The second electrode 412 is connected to the fourth busbar electrode 252. The second electrode 412 is located on the rear end side and the right end side of the interconnector 4. The second electrode 412 has a substantially circular shape when viewed from the up-down direction. The second electrode 412 has a left end edge 4121 located on the left side.

A second insertion hole 412*a* is formed in the second electrode 412. The second insertion hole 412*a* penetrates vertically. The second insertion hole 412*a* is formed, for example, substantially in the center of the second electrode 412. The second protruding end portion 25*b* of the fourth busbar electrode 252 is inserted into the second insertion hole 412*a* from below. The second protruding end portion 25*b* inserted into the second insertion hole 412*a* is bonded to the second electrode 412 by a bonding process such as soldering.

The first connector 413 connects the first electrode 411 and the second electrode 412. The first connector 413 extends in the front-rear direction so as to connect the first electrode 411 and the second electrode 412. In the first interconnector 41, the first electrode 411 and the second electrode 412 can be electrically connected via the first connector 413.

The first connector 413 has a first expanding and contracting portion 4131, a rear end portion 4132, a front end portion 4133, a left end edge 4134, and a right end edge 4135. The first expanding and contracting portion 4131 is located on the inner side in the front-rear direction. The rear end portion 4132 is located on the rear side, which is one side in the second direction. The front end portion 4133 is located on the front side, which is the other side in the second direction. The left end edge 4134 is located on the left side in the left-right direction. The right end edge 4135 is located on the right side.

The first expanding and contracting portion 4131 is sandwiched between the rear end portion 4132 and the front end portion 4133. The first expanding and contracting portion 4131 is formed in a line shape that meanders in a crank shape when viewed from the up-down direction. The first expanding and contracting portion 4131 is stretchable in a direction connecting the first electrode 411 and the second electrode 412.

The rear end portion 4132 is connected to the first electrode 411 while being curved from the front side to the right side that is the second photovoltaic cell 3 side. Specifically, the rear end portion 4132 is connected to the right end edge 4111 of the first electrode 411 while the right end edge 4135 is curved to the right as it approaches the first electrode 411 from the front side. Accordingly, the first connector 413 is gently connected to the first electrode 411.

The front end portion 4133 is connected to the second electrode 412 while being curved from the rear side to the left side, which is the first photovoltaic cell 2 side. Specifically, the front end portion 4133 is connected to the left end edge 4121 of the second electrode 412 while the left end edge 4134 is curved to the left as it approaches the second electrode 412 from the rear side. Accordingly, the first connector 413 is gently connected to the second electrode 412.

In the first interconnector 41, the first connector 413 is gently connected to the first and second electrodes 412. Thus, the stress generated at the rear end portion 4132 and the front end portion 4133 (in particular, the right end edge 4135 of the rear end portion 4132 and the left end edge 4134 of the front end portion 4133) when the first expanding and contracting portion 4131 of the first connector 413 is deformed can be suitably dispersed. Therefore, the first connector 413 is less likely to be broken. Here, the curvature of each of the rear end portion 4132 and the front end portion 4133 is smaller than that of the other portion of the first interconnector 41.

As described above, in the photovoltaic module 1, the first interconnector 41 connects the first busbar electrode 241 and the fourth busbar electrode 252, and the first busbar electrode 241 and the fourth busbar electrode 252 can be electrically connected through the first interconnector 41.

The second interconnector 42 has a shape symmetrical to the first interconnector 41 in the left-right direction. The second interconnector 42 includes a third electrode 421, a fourth electrode 422, and a second connector 423. The third electrode 421 is connected to the third busbar electrode 251. The third electrode 421 is located on the rear end side and the right end side of the interconnector 4. The third electrode 421 has a substantially circular shape when viewed from the up-down direction. The third electrode 421 has a left edge 4211 located on the left side.

A third insertion hole 421*a* is formed in the third electrode 421. The third insertion hole 421*a* penetrates vertically. The third insertion hole 421*a* is formed, for example, substantially in the center of the third electrode 421. The second protruding end portion 25*b* of the third busbar electrode 251 is inserted into the third insertion hole 421*a* from below. The second protruding end portion 25*b* inserted into the third insertion hole 421*a* is bonded to the third electrode 421 by a bonding process such as soldering.

The fourth electrode 422 is connected to the second busbar electrode 242. The fourth electrode 422 is located on the front end side and the left end side of the interconnector 4. The fourth electrode 422 has a substantially circular shape when viewed from the up-down direction. The fourth electrode 422 has a right edge 4221 located on the right side.

A fourth insertion hole 422*a* is formed in the fourth electrode 422. The fourth insertion hole 422*a* penetrates vertically. The fourth insertion hole 422*a* is formed, for example, substantially in the center of the fourth electrode 422. In the fourth insertion hole 422*a*, the first protruding end portion 24*b* of the second busbar electrode 242 is inserted from above. The first protruding end portion 24*b* inserted into the fourth insertion hole 422*a* is joined to the fourth electrode 422 by a joining process such as soldering.

The second connector 423 connects the third electrode 421 and the fourth electrode 422. The second connector 423 extends in the front-rear direction so as to connect the third electrode 421 and the fourth electrode 422. In the second interconnector 42, the third electrode 421 and the fourth electrode 422 can be electrically connected through the second connector 423.

The second connector 423 has a second expanding and contracting portion 4231, a rear end portion 4232, a front end portion 4233, a left end edge 4234, and a right end edge 4235. The second expanding and contracting portion 4231 is located inside in the front-rear direction. The rear end portion 4232 is located on the rear side in the front-rear direction. The front end portion 4233 is located on the front side. The left end edge 4234 is located on the left side in the left-right direction. The right end edge 4235 is located on the right side.

The second expanding and contracting portion 4231 is sandwiched between the rear end portion 4232 and the front end portion 4233. The second expanding and contracting portion 4231 is formed in a line shape that meanders in a crank shape when viewed from the up-down direction. The second expanding and contracting portion 4231 is elastically deformable in the left-right direction and the front-rear direction.

The rear end portion 4132 is connected to the third electrode 421 while being curved from the front side to the left side, which is the first photovoltaic cell 2 side. Specifically, the rear end portion 4132 is connected to the left end edge of the third electrode 421 while the left end edge is curved to the left as it approaches the third electrode 421 from the front side. Accordingly, the second connector 423 is gently connected to the third electrode 421.

The front end portion 4233 is connected to the fourth electrode 422 while being curved from the rear side to the right side, which is the second photovoltaic cell 3 side. Specifically, the front end portion 4233 is connected to the right end edge of the fourth electrode 422 while the right end edge is curved to the right as it approaches the fourth electrode 422 from the rear side in the front-rear direction. Accordingly, the second connector 423 is gently connected to the fourth electrode 422.

In the second interconnector 42, the second connector 423 is gently connected to the third and fourth electrodes 422. Accordingly, the stress generated at the rear end portion 4232 and the front end portion 4233 (in particular, the left end edge 4234 of the rear end portion 4232 and the right end edge 4235 of the front end portion 4233) when the second expanding and contracting portion 4231 of the second connector 423 is deformed can be suitably dispersed. Therefore, the second connector 423 is less likely to be broken. Here, in the present embodiment, the curvature of each of the rear end portion 4232 and the front end portion 4233 is smaller than that of the other portion of the second interconnector 42.

As described above, in the photovoltaic module 1, the second interconnector 42 connects the second busbar electrode 242 and the third busbar electrode 251, and the second busbar electrode 242 and the third busbar electrode 251 can be electrically connected through the second interconnector 42.

The shapes of the first and second expanding and contracting portions 4131, 4231 and the shapes of the first, second, third, and fourth electrodes 411, 412, 421, and 422 as viewed from the vertical direction can be appropriately changed according to the cell spacing. The shapes of the first and second expanding and contracting portions 4131, 4231 as viewed from the vertical direction are not limited to a linear shape that meanders in a crank shape, and may be, for example, a linear shape that meanders in a sinusoidal shape or a linear shape that meanders in a non-sinusoidal waveform. The shapes of the first, second, third, and fourth electrodes 411, 412, 421, and 422 as viewed in the up-down direction are not limited to substantially circular shapes, and may be other shapes such as substantially rectangular shapes, for example.

Figure 5:
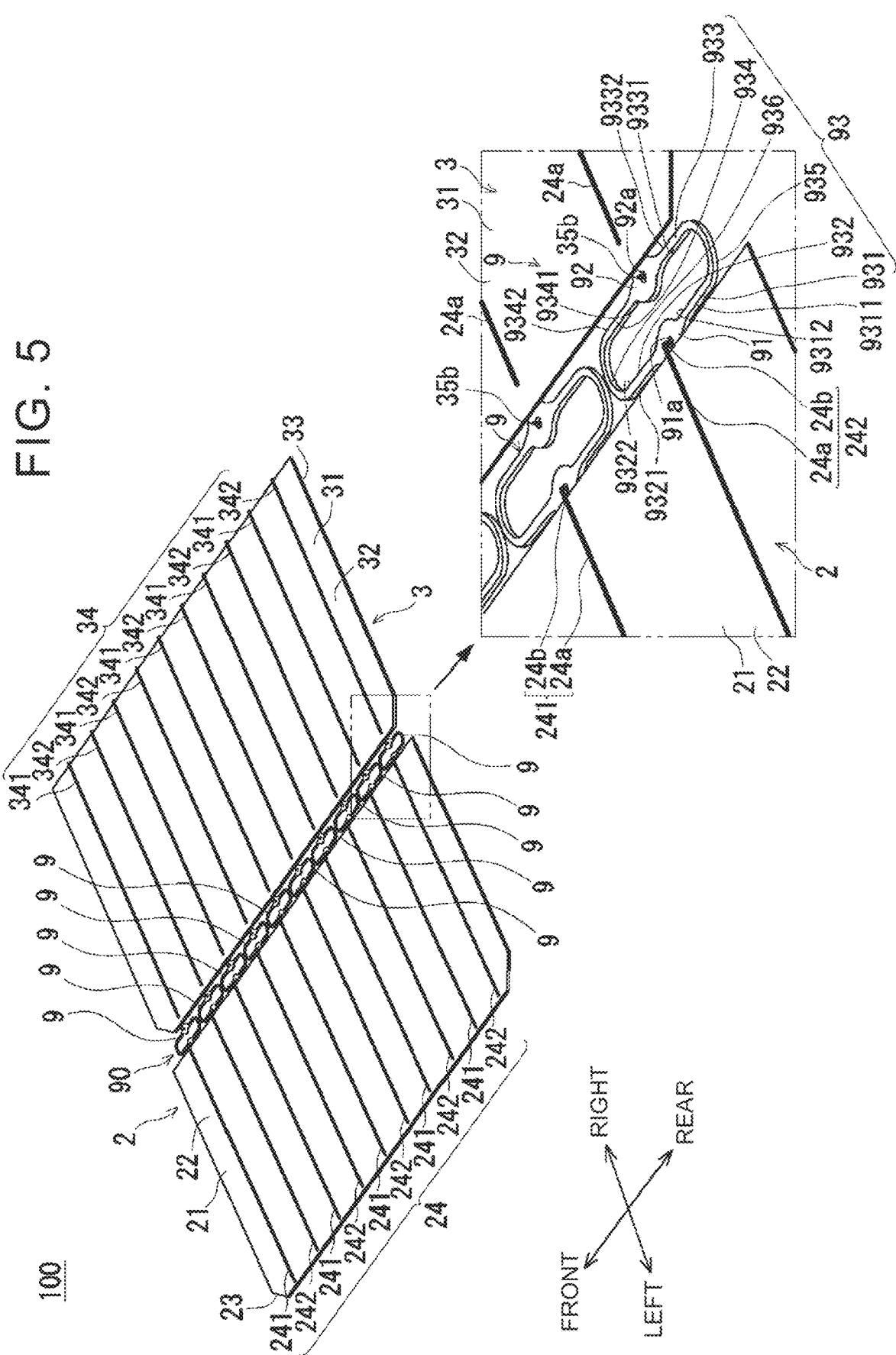
FIG. 5 is a perspective view illustrating a part of a photovoltaic module according to a comparative example.

Here, FIG. 5 is a perspective view showing a part of the photovoltaic module according to the comparative example. With reference to FIG. 5, a photovoltaic module 100 according to a comparative example will be described with a focus on differences from the photovoltaic module 1 according to the first embodiment.

FIG. 5 shows the first photovoltaic cell 2 and the second photovoltaic cell 3 connected by the interconnector 4 as corresponding to FIG. 2. An enlarged view of a part of the two-dot chain line in FIG. 5 is shown. As shown in FIG. 5, the photovoltaic module 100 according to the comparative example is configured in the same manner as the photovoltaic module 1 according to the first embodiment except that the interconnector 9 is provided instead of the interconnector 4.

The interconnector 9 is a wiring material that allows the first photovoltaic cell 2 and the second photovoltaic cell 3 to be electrically connected. The interconnector 9 has a flat plate shape that is horizontal to the first and second photovoltaic cells 2, 3. The interconnector 9 is located below the front surface electrode 24 and the first semiconductor substrate 21. The interconnector 9 is located below the front surface electrode 34 and the second semiconductor substrate 31.

In the photovoltaic module 100, the ten interconnectors 9 are connected to form an interconnector group 90 extending in the front-rear direction. The interconnector group 90 is disposed between the first photovoltaic cell 2 and the second photovoltaic cell 3. Ten interconnectors 9 included in the interconnector group 90 are integrally formed by punching a copper plate of the same Cu—Ni—P alloy as the interconnector 4.

The interconnector 9 includes a first electrode 91, a second electrode 92, and a connector 93. The first electrode 91 is located on the left end side of the interconnector 9. The first electrode 91 is connected to the first busbar electrode 241 provided in the first photovoltaic cell 2. The second electrode 92 is located on the right end side of the interconnector 9. The second electrode 92 is connected to the third busbar electrode 251 provided in the second photovoltaic cell 3. The connector 93 connects the first electrode 91 and the second electrode 92.

A first insertion hole 91a is formed in the first electrode 91 so as to penetrate vertically. The first protruding end portion 24b of the first busbar electrode 241 or the first protruding end portion 24b of the second busbar electrode 242 is inserted into the first insertion hole 91a from above. The first protruding end portion 24b inserted into the first insertion hole 91a is bonded to the first electrode 91 or the second electrode 92 by a bonding process such as soldering.

A second insertion hole 92a is formed in the second electrode 92 so as to extend vertically therethrough. The second protruding end portion 25b of the third busbar electrode 251 or the second protruding end portion 25b of the fourth busbar electrode 252 is inserted into the second insertion hole 92a from below. The second protruding end portion 25b inserted into the second insertion hole 92a is bonded to the third electrode 421 or the fourth electrode 422 by a bonding process such as soldering.

The connector 93 includes a first bypass portion 931 on one side, a second bypass portion 932 on one side, a first bypass portion 933 on the other side, a second bypass portion 934 on the other side, a first connecting portion 935, and a second connecting portion 936. The first bypass portion 931 on the one side and the first bypass portion 933 on the other side are located on the left side of the interconnector 9. The second bypass portion 932 on the one side and the second bypass portion 934 on the other side are located on the right side of the interconnector 9.

The first bypass portion 931 on the one side is connected to the first electrode 91 from the rear side. The first bypass portion 931 on the one side extends linearly toward the rear side of the interconnector 9 so as to be separated from the first electrode 91. The first bypass portion 931 on the one side has a left end edge 9311 and a right end edge 9312.

The first bypass portion 933 on the other side is connected to the first electrode 91 from the front side. The first bypass portion 933 on the other side has a shape symmetrical to the first bypass portion 931 on the one side in the front-rear direction. Accordingly, the first bypass portion 933 on the other side extends linearly toward the front side of the interconnector 9 so as to be separated from the first electrode 91. The first bypass portion 933 on the other side has a left end edge 9331 and a right end edge 9332.

The left end edges 9311 and 9331 of the first bypass portion 931 on the one side and the first bypass portion 933 on the other side are connected to the first electrode 91 while being curved toward the first photovoltaic cell 2. The first bypass portion 931 on the one side and the first bypass portion 933 on the other side are connected to the first electrode 91 while the right end edges 9312 and 9332 are curved toward the second photovoltaic cell 3.

The second bypass portion 932 on the one side is connected to the second electrode 92 from the rear side. The second bypass portion 932 on the one side has a shape symmetrical to the first bypass portion 931 on the one side in the left-right direction. The second bypass portion 932 on the one side extends linearly toward the rear side of the interconnector 9 so as to be separated from the first electrode 91. The second bypass portion 932 on the one side has a left end edge 9321 and a right end edge 9322.

The second bypass portion 934 on the other side is connected to the first electrode 91 from the front side. The second bypass portion 934 on the other side has a shape symmetrical to the first bypass portion 933 on the other side in the front-rear direction. Accordingly, the second bypass portion 934 on the other side extends linearly toward the front side of the interconnector 9 so as to be separated from the first electrode 91. The second bypass portion 934 on the other side has a left end edge 9341 and a right end edge 9342.

The left end edges 9321 and 9341 of the second bypass portion 932 on the one side and the second bypass portion 934 on the other side are connected to the first electrode 91 while being curved toward the first photovoltaic cell 2. The second bypass portion 932 on the one side and the second bypass portion 934 on the other side are connected to the first electrode 91 while the right end edges 9322 and 9342 are curved toward the second photovoltaic cell 3.

The first connecting portion 935 is located at the rear end of the connector 93. The first connecting portion 935 extends in the left-right direction while being curved in a substantially semicircular shape so as to approach the rear end of the first bypass portion 931 on the one side and the rear end of the second bypass portion 932 on the one side, respectively. The second connecting portion 936 is located at the front end of the connector 93. The second connecting portion 936 extends in the left-right direction while being curved in a substantially semicircular shape so as to approach the front end of the first bypass portion 933 on the other side and the front end of the second bypass portion 934 on the other side, respectively. Here, since the curvature of the first and second connecting portions is smaller than that of the other portions of the interconnector 9, the stress is more likely to be concentrated than that of the other portions.

The rear end of the first bypass portion 931 on the one side and the rear end of the second bypass portion 932 on the one side are connected by a first connection portion 935. The front end of the first bypass portion 933 on the other side and the front end of the second bypass portion 934 on the other side are connected by a second connecting portion 936. In this way, in the interconnector 9, the first electrode 91 and the second electrode 92 are connected by the connector 93, and the first electrode 91 and the second electrode 92 can be electrically connected through the connector 93.

As described above, in the photovoltaic module 100, one of the interconnectors 9 adjacent to each other in the front-rear direction connects the first busbar electrode 241 and the third busbar electrode 251. The other interconnector 9 connects the second busbar electrode 242 and the fourth busbar electrode 252.

The interconnector 9 provided in the photovoltaic module 100 is deformed such that the first bypass portion and the second bypass portion of the connector 93 are closer to each other in the left-right direction in response to a narrowing of the cell spacing due to contraction caused by the temperature change at the time of manufacture or use. Further, the interconnector 9, when the cell spacing is widened by the expansion due to the temperature change during manufacturing or use, the first bypass portion and the second bypass portion of the connector 93 accordingly deforms so as to be separated from each other in the left-right direction.

Figure 6A:
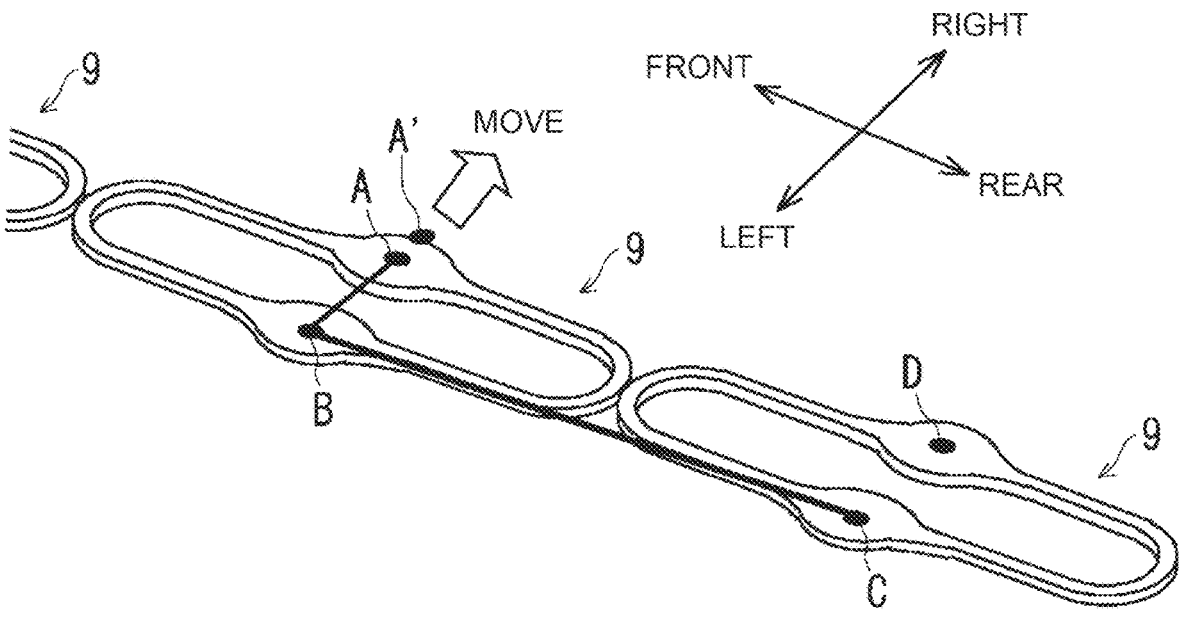
FIG. 6A is a diagram illustrating a modification of the interconnector that occurs when the photovoltaic module according to the comparative example is stretched by temperature-change.
Figure 6B:
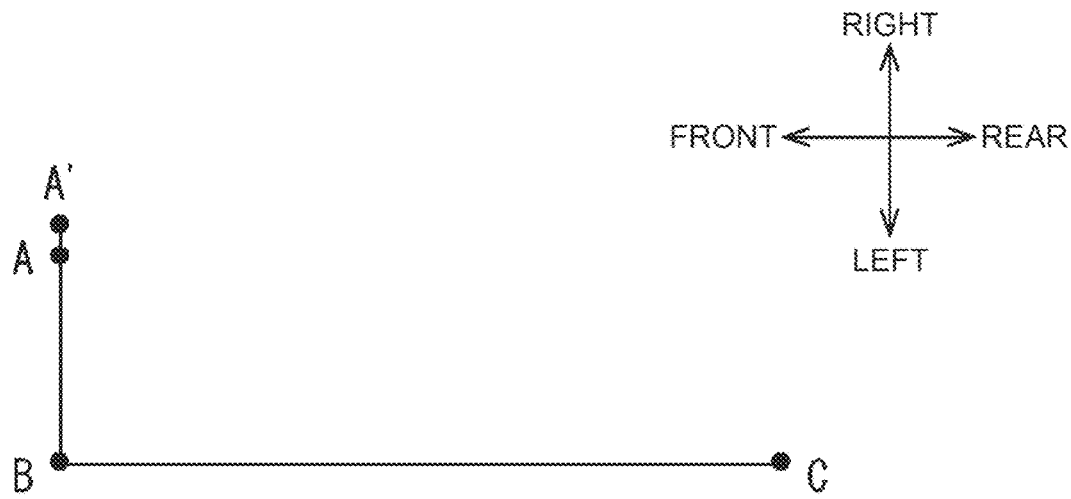
FIG. 6B is a view illustrating a modification of the interconnector that occurs when the photovoltaic module according to the comparative example is extended by a change in temperature.

A problem of the photovoltaic module 100 will be described with reference to FIGS. 6A and 6B. FIGS. 6A and 6B are each a diagram for explaining dimensional changes of interconnectors that occur when a photovoltaic module according to a comparative example is stretched due to temperature changes.

A point A shown in FIG. 6A is a connecting point between the second electrode 92 of the interconnector 9 and the third busbar electrode 251 prior to the photovoltaic module 100 being extended by the temperature change. A point A' shown in FIG. 6A is a connecting point between the second electrode 92 of the interconnector 9 and the third busbar electrode 251 after the photovoltaic module 100 has been expanded due to a change in temperature. Point B shown in FIG. 6A is a connecting point between the first electrode 91 of the interconnector 9 and the first busbar electrode 241 before and after the photovoltaic module 100 expands due to a change in temperature. A point C shown in FIG. 6A is a connecting point between the first electrode 91 of the interconnector 9 and the second busbar electrode 242 before and after the photovoltaic module 100 expands due to a change in temperature. Point D shown in FIG. 6A is a connecting point between the second electrode 92 of the interconnector 9 and the fourth busbar electrode 252 before and after the photovoltaic module 100 expands due to a change in temperature. In FIG. 6B, the positional relation between the points A, A', B, and C when the interconnector 9 is viewed from above is shown.

As shown in FIG. 6A, the second photovoltaic cell 3 is displaced in the right direction away from the first photovoltaic cell 2 with respect to the first photovoltaic cell 2 due to the expansion caused by the temperature change. Then, as indicated by a white arrow in FIG. 6A, the connecting point between the second electrode 92 and the third busbar electrode 251 moves from the point A to the point A'. As described above, when the connecting point between the second electrode 92 and the third busbar electrode 251 moves, the spacing between the point A and the point B extends to the spacing between the point A' and the point B. Thus, since the interconnector 9 extends in the same direction as the direction in which the spacing between the first electrode 91 and the second electrode 92 is displaced by the second photovoltaic cell 3, a large dimensional change due to a temperature change occurs in the interconnector 9.

In particular, when both the front surface member 6 and the back surface member 7 are made of resin, their thermal expansion coefficient (linear expansion coefficient) is larger than that of the first and second semiconductor substrates 21 and 31 and glass of crystalline silicon. Therefore, when the photovoltaic module 100 expands and contracts due to the temperature change, the dimensional change of the interconnector 9 becomes remarkable. Therefore, the present inventors conducted an experiment to confirm the change in cell spacing with respect to the temperature change on the photovoltaic module 100 in which both the front surface member 6 and the back surface member 7 are made of a resin containing a polycarbonate resin and an acrylic resin.

Figure 4:
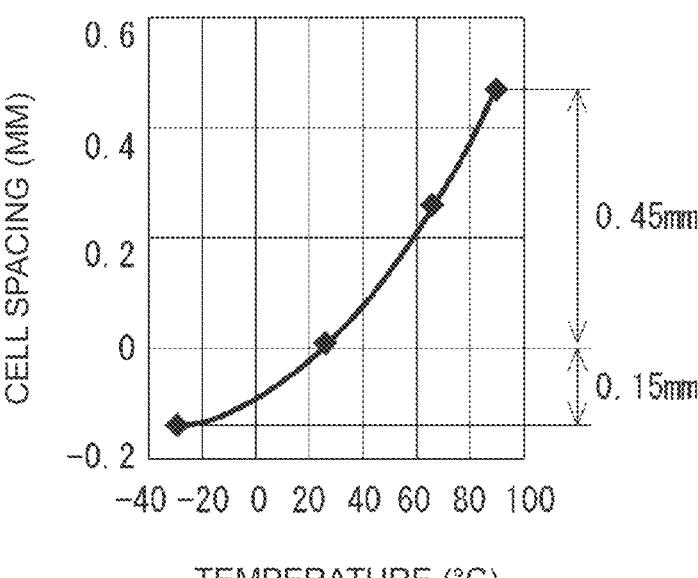
FIG. 4 is a diagram illustrating a change in an interconnector that occurs when the photovoltaic module according to the first embodiment expands due to a change in temperature.

FIG. 4 is a graph showing a change in spacing between the first photovoltaic cell 2 and the second photovoltaic cell 3 with respect to a temperature change. The horizontal axis of the graph shown in FIG. 4 shows the ambient temperature (° C.). The vertical axis of the graph illustrated in FIG. 4 indicates a cell spacing (mm) which is a spacing between the first photovoltaic cell 2 and the second photovoltaic cell 3.

As can be seen from the graph of FIG. 4, when the ambient temperature was lowered from 20° C. (room temperature) to −30° C., the cell spacing became 0.15 mm narrower than that at room temperature. On the other hand, when the ambient temperature was increased from 20° C. (normal temperature) to 90° C., the cell spacing became 0.45 mm wider than that at normal temperature.

From the experimental results, it was found that the change in cell spacing is larger when the temperature change on the high-temperature side (20° C. to 90° C.) is given to the photovoltaic module 100 than when the temperature change on the low-temperature side (20° C. to −30° C.) is given. When the photovoltaic modules 1 and 100 are mounted on a vehicle body and used, it is necessary to consider a temperature of about 90° C. as a worst-case condition.

The strength of the interconnector 9 when a temperature change is applied to the photovoltaic module 100 to raise the ambient temperature from 20° C. to 90° C. was simulated by an analysis using FEM (Finite Element Method).

FEM analysis confirmed that tensile stresses (688 Mpa) in excess of the tensile strength (610 MPa) of the interconnector 9 using KLF170 can occur in the first and second connecting portions 935 and 936. As can be seen from the evaluation result, in the case where the first photovoltaic cell 2 and the second photovoltaic cell 3 are allowed to be electrically connected via the interconnector 9, stress tends to concentrate on a small-curvature portion of the interconnector 9 when the cell spacing changes. Therefore, in the photovoltaic module 100, there is a problem that the first photovoltaic cell 2 and the second photovoltaic cell 3 may not be suitably electrically connected due to breakage of the interconnector 9.

On the other hand, the photovoltaic module 1 according to the present embodiment includes a first photovoltaic cell 2, a second photovoltaic cell 3 located adjacent to and spaced apart from the first photovoltaic cell 2 in the left-right direction that is the first direction, and an interconnector 4 that allows the first photovoltaic cell 2 and the second photovoltaic cell to be electrically connected. The first photovoltaic cell 2 includes a first busbar electrode 241 and a second busbar electrode 242 that are located adjacent to and spaced apart from each other in the front-rear direction that is the second direction. The second photovoltaic cell 3 includes a third busbar electrode 251 and a fourth busbar electrode 252 that are adjacent and spaced apart from each other in the front-rear direction that is the second direction. The third busbar electrode 251 is located next to the first busbar electrode 241 substantially linearly in the left-right direction that is the first direction. The fourth busbar electrode 252 is located next to the second busbar electrode 242 substantially linearly in the left-right direction that is the first direction.

The interconnector 4 includes a first interconnector 41 including a first electrode 411, a second electrode 412, and a first connector 413. The first electrode 411 is connected to the first busbar electrode 241. The second electrode 412 is connected to the fourth busbar electrode 252. The first connector 413 connects the first electrode 411 and the second electrode 412. The interconnector 4 includes a second interconnector 42 including a third electrode 421, a fourth electrode 422, and a second connector 423. The third electrode 421 is connected to the second busbar electrode 242. The fourth electrode 422 is connected to the third busbar electrode 251. The second connector 423 connects the third electrode 421 and the fourth electrode 422. Further, the first connector 413 has a first expanding and contracting portion 4131 that is expandable and contractible in a direction connecting the first electrode 411 and the second electrode 412, and the second connector 423 has a second expanding and contracting portion 4231 that is expandable and contractible in a direction connecting the third electrode 421 and the second electrode 412.

Figure 3A:
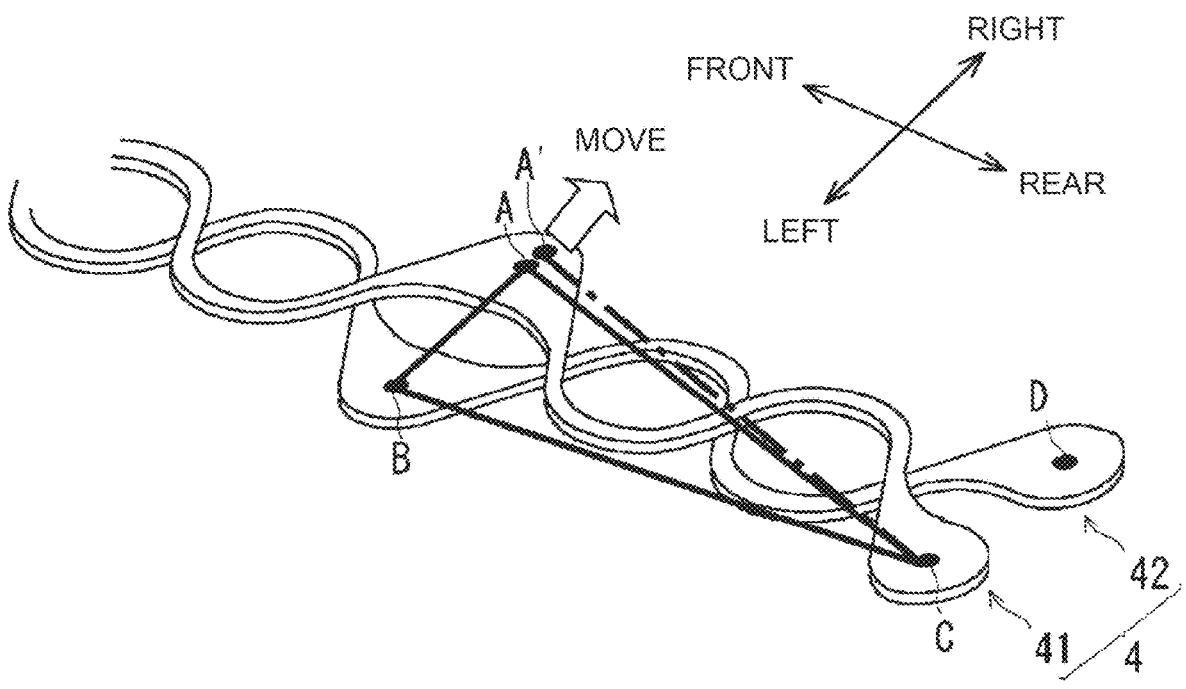
FIG. 3A is a diagram illustrating a dimensional change of an interconnector caused when a photovoltaic module according to the first embodiment is stretched due to a temperature change.
Figure 3B:
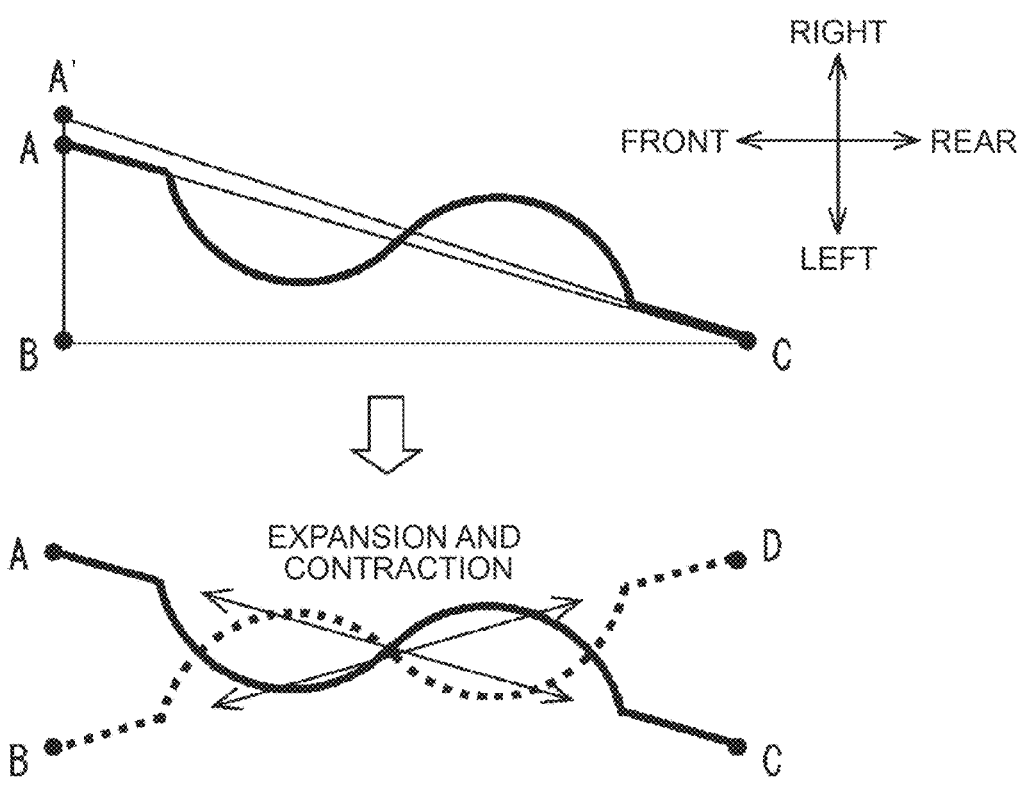
FIG. 3B is a diagram illustrating a dimensional change of an interconnector caused when a photovoltaic module according to the first embodiment is stretched due to a temperature change.

Here, FIGS. 3A and 3B are each a diagram for explaining the dimensional change of the interconnector 4 that occurs when the photovoltaic module 1 according to the first embodiment expands due to a temperature change.

A point A shown in FIG. 3A is a connecting point between the third electrode 421 of the interconnector 4 and the third busbar electrode 251 prior to the photovoltaic module 1 being extended by the change in temperature. A point A' shown in FIG. 3A is a connecting point between the third electrode 421 of the interconnector 4 and the third busbar electrode 251 after the photovoltaic module 1 is stretched due to a change in temperature. Point B shown in FIG. 3A is a connecting point between the first electrode 411 of the interconnector 4 and the first busbar electrode 241 before and after the photovoltaic module 1 is extended by the temperature change. A point C shown in FIG. 3A is a connecting point between the fourth electrode 422 of the interconnector 4 and the second busbar electrode 242 before and after the photovoltaic module 1 expands due to a change in temperature. A point D shown in FIG. 3A is a connecting point between the second electrode 412 of the interconnector 4 and the fourth busbar electrode 252 before and after the photovoltaic module 1 expands due to a change in temperature. In FIG. 3B, the positional relation between the points A, A', B, and C when the interconnector 4 is viewed from above is shown.

As shown in FIG. 3A, the second photovoltaic cell 3 is displaced in the right direction away from the first photovoltaic cell 2 with respect to the first photovoltaic cell 2 due to the expansion caused by the temperature change. Then, as indicated by the white arrow in FIG. 3B, the connecting point between the third electrode 421 and the third busbar electrode 251 moves from the point A to the point A'. As described above, when the third electrode 421, the third busbar electrode 251, and the connection point move, the distance between the point A and the point C increases to the distance between the point A' and the point C. As described above, according to the interconnector 4, the spacing between the first electrode 411 and the fourth electrode 422 extends in the direction connecting the first electrode 411 and the fourth electrode 422 which intersect the direction in which the second photovoltaic cell 3 is displaced. Therefore, the dimensional change occurring in the interconnector 4 is smaller than the dimensional change occurring in the interconnector 9.

In the photovoltaic module 1 according to the present embodiment, when the cell spacing becomes wider due to the expansion of the photovoltaic module 1 due to the temperature change, a load drawn to both sides in the left-right direction by the first photovoltaic cell 2 and the second photovoltaic cell 3 acts on the interconnector 4. When the photovoltaic module 1 expands due to a temperature change, the first expanding and contracting portion 4131 of the interconnector 4 is extended in a direction connecting the first electrode 411 and the fourth electrode 422 by a load drawn from the first photovoltaic cell 2 and the second photovoltaic cell 3. The second expanding and contracting portion 4231 extends in a direction connecting the second electrode 412 and the third electrode 421. Therefore, dimensional change of the interconnector 4 to both sides in the left-right direction can be suppressed.

In the photovoltaic module 1 according to the present embodiment, when the cell spacing is narrowed due to contraction of the photovoltaic module 1 due to the temperature change, a load drawn to both sides in the left-right direction by the first photovoltaic cell 2 and the second photovoltaic cell 3 acts on the interconnector 4. When the photovoltaic module 1 contracts due to a temperature change, the first expanding and contracting portion 4131 of the interconnector 4 contracts in a direction connecting the first electrode 411 and the fourth electrode 422 by a load pressed by the first photovoltaic cell 2 and the second photovoltaic cell 3. The second expanding and contracting portion 4231 contracts in a direction connecting the second electrode 412 and the third electrode 421. Therefore, dimensional change of the interconnector 4 toward the inside in the left-right direction can be suppressed.

In the photovoltaic module 1 according to the present embodiment, as described above, when the photovoltaic module 1 expands and contracts due to a temperature change, the first expanding and contracting portion 4131 expands and contracts in a direction connecting the first electrode 411 and the fourth electrode 422. The second expanding and contracting portion 4231 expands and contracts in a direction connecting the second electrode 412 and the third electrode 421. Thus, dimensional change of the interconnector 4 in the front-rear direction due to the difference in the coefficient of linear expansion between the first and second photovoltaic cells 2, 3 and the interconnector 4 can be suppressed.

In the photovoltaic module 1 described above, it is preferable that the first expanding and contracting portion 4131 and the second expanding and contracting portion 4231 each have a meandering shape.

According to such a configuration, when the cell spacing changes due to contraction of the photovoltaic module 1 due to the temperature change, the first expanding and contracting portion 4131 and the second expanding and contracting portion 4231 having a meandering shape are elastically deformed. Thus, the stress generated in the interconnector 4 can be reduced.

Here, the strength of the interconnector 4 when a temperature change that increases the ambient temperature from 20° C. to 90° C. is applied to the photovoltaic module 1 was evaluated on the basis of simulations by analysis using FEM.

FEM analysis confirmed that the tensile stress (478 Mpa) generated at the rear end portions 4132 and 4232 and the front end portions 4133 and 4233, which are more susceptible to stress concentration than other portions of the interconnector 4, is lower than the tensile strength (610 MPa) of the interconnector 4 using KLF170 (registered trademark). As can be seen from the evaluation result, in the case where the first photovoltaic cell 2 and the second photovoltaic cell 3 are allowed to be electrically connected via the interconnector 4, the interconnector 4 is less likely to be broken even if stress is generated in a portion of the interconnector 4 that has a smaller curvature than the remaining portion of the interconnector 4 when the cell spacing changes.

In the photovoltaic module 1 described above, the first photovoltaic cell 2 has a first semiconductor substrate 21 including a first substrate front surface 22 and a second substrate back surface 33. A first busbar electrode 241 and a second busbar electrode 242 are formed on the first substrate front surface 22. The third busbar electrode 251 and the fourth busbar electrode 252 are formed on the second substrate back surface 33. The second photovoltaic cell 3 has a second semiconductor substrate 31 including a second substrate front surface 32 on which the first busbar electrode 241 and the second busbar electrode 242 are formed, a second substrate back surface 33 on which the third busbar electrode 251 and the fourth busbar electrode 252 are formed.

According to such a configuration, by providing the double-sided electrode type first and second photovoltaic cells 2, 3 that are allowed to be electrically connected via the interconnector 4, it is possible to realize the photovoltaic module 1 that improves the power generation efficiency and suppresses the decrease in the power generation amount due to the breakage of the first and second photovoltaic cells 2, 3 and the breakage of the interconnector 4.

In the photovoltaic module 1, the first busbar electrode 241 and the second busbar electrode 242 have first protruding end portions 24b protruding from the first semiconductor substrate 21 toward the second photovoltaic cell 3. The third busbar electrode 251 and the fourth busbar electrode 252 each have a second protruding end portion 25b protruding beyond the second semiconductor substrate 31 toward the first photovoltaic cell 2. The first connector 413 includes a first electrode 411 in which the first insertion hole 411a is formed, and a second electrode 412 in which the second insertion hole 412a is formed. The first protruding end portion 24b of the first busbar electrode 241 is inserted into the first insertion hole 411a from above. The second protruding end portion 25b of the fourth busbar electrode 252 is inserted into the second insertion hole 412a from below. The second connector 423 includes a third electrode 421 in which the third insertion hole 421a is formed, and a fourth electrode 422 in which the fourth insertion hole 422a is formed. The second protruding end portion 25b of the third busbar electrode 251 is inserted into the third insertion hole 421a from above. The first protruding end portion 24b of the second busbar electrode 242 is inserted into the fourth insertion hole 422a from below.

According to such a configuration, the first photovoltaic cell 2 and the second photovoltaic cell 3 can be suitably connected to the interconnector 4 without interference between the first interconnector 41 and the second interconnector 42.

In addition, the interconnector 4 according to the present embodiment allows the first photovoltaic cell 2 and the second photovoltaic cell 3 located adjacent to and spaced apart from the first photovoltaic cell 2 in the first direction to be electrically connected. The first photovoltaic cell 2 includes a first busbar electrode 241 and a second busbar electrode 242 that are located adjacent to and spaced apart from each other in a second direction substantially perpendicular to the first direction. The second photovoltaic cell 3 includes a third busbar electrode 251 and a fourth busbar electrode 252 that are located adjacent to and spaced apart from each other in the second direction. The third busbar electrode 251 is located next to the first busbar electrode 241 substantially linearly in the first direction. The fourth busbar electrode 252 is located next to the second busbar electrode 242 substantially linearly in the first direction.

The interconnector 4 includes a first interconnector 41 including a first electrode 411, a second electrode 412, and a first connector 413. The first electrode 411 is connected to the first busbar electrode 241. The second electrode 412 is connected to the fourth busbar electrode 252. The first connector 413 connects the first electrode 411 and the second electrode 412. The interconnector 4 includes a second interconnector 42 including a third electrode 421, a fourth electrode 422, and a second connector 423. The third electrode 421 is connected to the second busbar electrode 242. The fourth electrode 422 is connected to the third busbar electrode 251. The second connector 423 connects the third electrode 421 and the fourth electrode 422. Further, the first connector 413 has a first expanding and contracting portion 4131 that is expandable and contractible in a direction connecting the first electrode 411 and the second electrode 412, and the second connector 423 has a second expanding and contracting portion 4231 that is expandable and contractible in a direction connecting the third electrode 421 and the second electrode 412.

In the interconnector 4 according to the present embodiment, when the cell spacing increases due to expansion caused by the temperature change, the first expanding and contracting portion 4131 is extended in the direction connecting the first electrode 411 and the fourth electrode 422 by the load drawn from the first photovoltaic cell 2 and the second photovoltaic cell 3. The second expanding and contracting portion 4231 extends in a direction connecting the second electrode 412 and the third electrode 421. Therefore, dimensional change of the interconnector 4 to both sides in the left-right direction can be suppressed.

In the interconnector 4 according to the present embodiment, when the cell spacing becomes narrower due to contraction due to temperature change, the first expanding and contracting portion 4131 contracts in the direction connecting the first electrode 411 and the fourth electrode 422 by the load pressed from the first photovoltaic cell 2 and the second photovoltaic cell 3. The second expanding and contracting portion 4231 contracts in a direction connecting the second electrode 412 and the third electrode 421. Therefore, dimensional change of the interconnector 4 toward the inside in the left-right direction can be suppressed.

In the interconnector 4 according to the present embodiment, as described above, the first expanding and contracting portion 4131 expands and contracts in the direction connecting the first electrode 411 and the fourth electrode 422 when the first expansion and contraction portion expands and contracts due to the temperature change. The second expanding and contracting portion 4231 expands and contracts in a direction connecting the second electrode 412 and the third electrode 421. Thus, dimensional change of the interconnector 4 in the front-rear direction due to the difference in the coefficient of linear expansion between the first and second photovoltaic cells 2, 3 and the interconnector 4 can be reduced.

As described above, the present embodiment can provide the photovoltaic module 1 and the interconnector 4 that can reduce the possibility of defective electrical connection between the first photovoltaic cell 2 and the second photovoltaic cell 3 when the spacing between the adjacent first and second photovoltaic cells 2, 3 changes and that have improved durability.

The present disclosure is not limited to the above-described embodiments, and can be appropriately modified without departing from the scope of the present disclosure.

What is claimed is:

1. A photovoltaic module, comprising:

a first photovoltaic cell;

a second photovoltaic cell located adjacent to and spaced apart from the first photovoltaic cell in a first direction; and an interconnector that allows the first photovoltaic cell and the second photovoltaic cell to be electrically connected, wherein:

the first photovoltaic cell includes a first busbar electrode and a second busbar electrode that are located adjacent to and spaced apart from each other in a second direction substantially perpendicular to the first direction;

the second photovoltaic cell includes a third busbar electrode and a fourth busbar electrode that are located adjacent to and spaced apart from each other in the second direction, the third busbar electrode being located next to the first busbar electrode substantially linearly in the first direction, and the fourth busbar electrode being located next to the second busbar electrode substantially linearly in the first direction;

the interconnector includes a first interconnector including a first electrode connected to the first busbar electrode, a second electrode connected to the fourth busbar electrode, and a first connector connecting the first electrode and the second electrode; and a second interconnector including a third electrode connected to the second busbar electrode, a fourth electrode connected to the third busbar electrode, and a second connector connecting the third electrode and the fourth electrode;

the first connector includes a first expanding and contracting portion that is expandable and contractible in a direction connecting the first electrode and the second electrode;

the second connector includes a second expanding and contracting portion that is expandable and contractible in a direction connecting the third electrode and the fourth electrode;

the first photovoltaic cell includes a first semiconductor substrate including a first substrate front surface on which the first busbar electrode and the second busbar electrode are located and a first substrate back surface;

the second photovoltaic cell includes a second semiconductor substrate including a second substrate front surface and a second substrate back surface on which the third busbar electrode and the fourth busbar electrode are located;

each of the first busbar electrode and the second busbar electrode includes a first protruding end portion protruding beyond the first semiconductor substrate toward the second photovoltaic cell;

each of the third busbar electrode and the fourth busbar electrode includes a second protruding end portion protruding beyond the second semiconductor substrate toward the first photovoltaic cell;

the first connector includes the first electrode having a first insertion hole in which the first protruding end portion of the first busbar electrode is inserted from above, and the second electrode having a second insertion hole in which the second protruding end portion of the fourth busbar electrode is inserted from below; and the second connector includes the third electrode having a third insertion hole in which the second protruding end portion of the third busbar electrode is inserted from below, and the fourth electrode having a fourth insertion hole in which the first protruding end portion of the second busbar electrode is inserted from above.

2. The photovoltaic module according to claim 1, wherein each of the first expanding and contracting portion and the second expanding and contracting portion has a meandering shape.

* * * * *